(12) United States Patent
Pierdomenico

(10) Patent No.: US 8,232,834 B2
(45) Date of Patent: Jul. 31, 2012

(54) BOOSTING XDSL AMPLIFIER SUPPLY POWER ON-DEMAND

(75) Inventor: John Pierdomenico, Temple, PA (US)

(73) Assignee: Analog Devices, Inc., Norwood, MA (US)

( * ) Notice: Subject to any disclaimer, the term of this patent is extended or adjusted under 35 U.S.C. 154(b) by 283 days.

(21) Appl. No.: 12/535,812

(22) Filed: Aug. 5, 2009

(65) Prior Publication Data

US 2010/0283534 A1    Nov. 11, 2010

Related U.S. Application Data

(60) Provisional application No. 61/176,251, filed on May 7, 2009.

(51) Int. Cl.
*G05F 1/10* (2006.01)

(52) U.S. Cl. .............. 327/536; 330/124 R; 330/295; 330/297

(58) Field of Classification Search ........... 330/124 R, 330/295–297, 84, 127
See application file for complete search history.

(56) References Cited

U.S. PATENT DOCUMENTS

| | | |
|---|---|---|
| 6,466,088 B1 | 10/2002 | Rezvani et al. |
| 6,498,521 B1 | 12/2002 | Bicakci et al. |
| 6,636,103 B2 | 10/2003 | Wureer et al. |
| 6,917,240 B2 | 7/2005 | Tafton et al. |
| 7,215,195 B2 | 5/2007 | Ozasa et al. |
| 7,505,855 B2 | 3/2009 | Blake et al. |
| 2006/0284806 A1 | 12/2006 | Maki |

OTHER PUBLICATIONS

Bicakci et al., A 700 mW CMOS line driver for ADSL central office applications, *Solid-State Circuits Conference, 2003. Digest of Technical Papers. ISSCC. 2003 IEEE International* Publication Date: 2003.
PCT International Search Report and Written Opinion for PCT/US2010/032928 mailed on Jul. 2, 2010.

*Primary Examiner* — Hieu Nguyen

(74) *Attorney, Agent, or Firm* — Kenyon & Kenyon LLP

(57) ABSTRACT

Systems and methods for increasing amplifier supply power on demand for a plurality of xDSL signals is provided. In an embodiment, circuitry may be used to detect the signal or signals having the highest voltage. In different embodiments, the signal(s) with the highest absolute voltage or highest combined voltage between complementary signal pairs may be compared to a threshold voltage, such as an existing amplifier supply voltage. In different embodiments, when these highest voltage(s) exceed the threshold voltage, the corresponding amplifier supply voltages may be increased to meet the increased amplification demand. In some embodiments when these highest voltage(s) do not exceed the threshold voltage, the amplifier supply voltage may not be increased and the existing amplifier supply voltage may be used to amplify the xDSL signals.

22 Claims, 5 Drawing Sheets

FIG. 2

Operational Truth Table

| Channel #1 | | Channel #2 | | CH #1 | CH #2 | Pumps | Ichrg | Amp #1 Bias | Amp #2 Bias |
|---|---|---|---|---|---|---|---|---|---|
| PD0 | PD1 | PD0 | PD1 | | | | | | |
| Low | Low | Low | Low | P17/P30 | P17/P30 | Off | Off | | |
| High | High | High | High | Off | Off | Off | Off | High | High |
| Low | High | High | High | 2+ | Off | On | 1X | Off | Off |
| High | Low | High | High | 8b | Off | On | 1X | Low | Off |
| High | High | Low | High | Off | 2+ | On | 1X | High | Off |
| High | High | High | Low | Off | 8b | On | 1X | Off | Low |
| Low | High | Low | High | 2+ | 2+ | On | 2X | Low | Low |
| High | Low | High | Low | 8b | 8b | On | 2X | High | High |
| Low | High | High | Low | 2+ | 8b | On | 2X | High | Low |
| High | Low | Low | High | 8b | 2+ | On | 2X | Low | High |

201 ↗  202 ↗

BOOSTING XDSL AMPLIFIER SUPPLY POWER ON-DEMAND

CROSS-REFERENCE TO RELATED APPLICATIONS

This application claims priority under 35 U.S.C. §119 to U.S. Provisional Patent Application No. 61/176,251, filed on May 7, 2009, and entitled "Method and Apparatus for On-Demand Supply Boost xDSL Amplifier System," which is herein incorporated by reference in its entirety.

BACKGROUND

Digital subscriber loop or line technology (xDSL) has enabled digital data, such as web pages and computer files to be transmitted at high speeds over telephone wires used for local phone service. Data in xDSL systems is typically transmitted over these telephone wires through voltage signal fluctuations.

In most circumstances, the voltage fluctuations used fall within a fixed range, but occasionally data may be transmitted through voltage fluctuations that exceed the fixed range. Since xDSL systems use amplifiers to boost voltage signals before transmitting them, an issue arises relating to the amount of supply voltage that is used to power the amplifiers that are processing these signals. For example, an amplifier with sufficient supply voltage to boost or amplify voltage signals solely to encompass voltage fluctuations within the fixed range, will in most instances accurately transmit data. However, in the occasional instances where the voltage fluctuations exceed the fixed range, the amplifier will not be able to accurately reproduce the voltage signal, since the voltage fluctuations exceed the amplification ability of the amplifier, resulting in data loss ("clipping").

To overcome this limitation, supply voltages will be selected to properly supply the amplifier so that it will accurately amplify xDSL voltage signals in all instances, including the occasional instance when the voltage fluctuation exceeds the fixed range. While this amplifier will accurately transmit data in all instances, the overall system is inefficient and wastes power because in most instances the voltage fluctuations will be within the fixed range and not the occasional voltage fluctuation range that the system is designed to accurately amplify. Many xDSL systems today use this type of non-efficient amplifier system.

One technique for improving amplifier efficiency in these circumstances is described in U.S. Pat. No. 6,636,103, commonly owned with this application by Analog Devices, Inc. The contents of U.S. Pat. No. 6,636,103 are incorporated by reference herein. The '103 patent discloses an amplifier system for a single input channel that uses a charge pump to increase the voltage applied to the amplifier beyond the fixed range in the occasional instances when the voltage fluctuation exceeds the fixed range. However, using the system disclosed in this patent to amplify signals in a multi-channel xDSL system may also result in inefficiencies, as each input channel may have its own amplifier and charge pump to independently amplify voltage signals on each channel. This system is also only geared toward a single xDSL application.

Thus, there is a need for an efficient multi-channel xDSL signal amplification system supporting instantaneous amplifier power supply needs in response to a fluctuating input signal.

BRIEF DESCRIPTION OF THE DRAWINGS

FIG. 2 shows an operational truth table used by a controller in an embodiment of the invention.

DETAILED DESCRIPTION

Embodiments of the invention provide an amplifier system in which a plurality of input channels are connected to a common amplifier interface that includes a single charge pump. The voltage levels on each input channel may be compared and the highest voltage level may be used for signal amplification on each of the input channels. When the highest amplifier output voltage level exceeds the range of the system using existing supply voltages, the charge pump may supply additional voltage to the amplifier interface to expand the amplifier range to accommodate the highest voltage level. When the highest amplifier output voltage level does not exceed the range of the amplifier, no additional power may be necessary, and the charge pump may not supply additional power to the amplifier.

In an embodiment, a multi-channel amplifier system may comprise a plurality of amplifiers, each having an input for a respective input channel and having a power supply input, a charge pump system coupled to the power supply inputs of the amplifiers, and a control system for the charge pump system, comprising logic to identify a maximum signal value from among all the input channels and to deliver the maximum signal value to the charge pump system as a control signal.

In other embodiments, control logic may be used to alter settings in the amplification system so that the amplification system can be reconfigured to adjust to signal changes. For example, an operational truth table may be used to select settings such as the current charge, amplifier bias, charge pump use.

Figure 1:
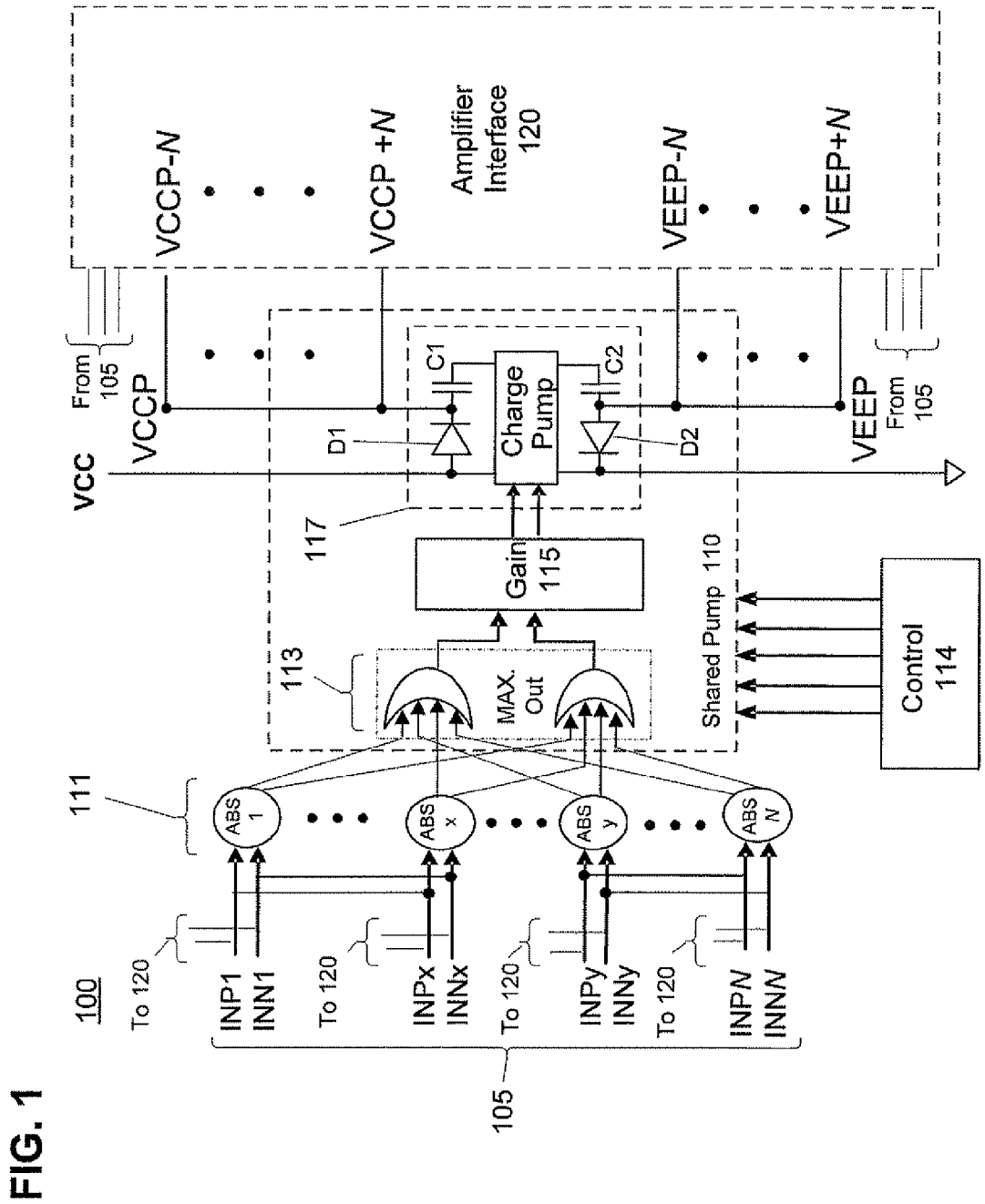
FIG. 1 shows an embodiment of a multi-channel on-demand supply boost xDSL amplifier system.

FIG. 1 shows an embodiment of a multi-channel on-demand supply boost xDSL amplifier system 100. The amplifier system 100 may have a plurality of input channels 105, a shared pump 110, a control 114 and an amplifier interface 120. Each of the N input channels 105 may have a differential pair of input signals, for example INPx and INNx. The amplifier system 100 may also include absolute value circuitry 111 to output an absolute value of the differential voltages on each of the plurality of input channels 105. The absolute value output from each complementary pair of signals may be sent to a shared charge pump 110. The charge pump 110 may modulate the supply voltages delivered to amplifiers 120 based on the inputs from the channels 105.

In some embodiments, the absolute value output may include AC gain. Different embodiments may use different types of absolute value circuitry, such as one or more rectifier circuits, ABS1 to ABSN.

In an embodiment, the shared pump 110 may have a maximum out block 113, a gain block 115 and a charge pump 117. The maximum out block 113 may include logic, such as digital or analog OR gates, that receive the absolute value output from absolute value circuitry 111 and selects the maximum value. The highest absolute voltage output from each complimentary pair may then be inputted to gain block 115.

Gain block 115 may apply AC and/or DC gain to the signals received from the maximum out block 113 and send the highest absolute voltage complimentary pair outputs to the charge pump 117. A first output may be sent to the positive amplifier power supply VCCP and a second output to the negative amplifier power supply VEEP. The gain block 115 may also apply additional AC and/or DC gain as determined by a controller 114.

Charge Pump 117 may generate increased amplifier power supply voltages for the amplifiers when the signal levels from gain block 115 exceed a voltage supported by existing amplifier supply voltages. In an embodiment, the charge pump 117 may receive the amplified signals from gain block 115 and may also receive an amplifier supply voltage VCC, which may be positive, and/or an amplifier supply voltage VEE, which may be negative.

In some embodiments, the amplifier supply voltages VCC and/or VEE may be nominal supply voltages, such as +/−6 Volts, or +12V and ground, for an amplifier in the amplifier interface 120. In an embodiment the charge pump 117 may operate at approximately 8 Mhz. This embodiment may be used to provide VDSL functionality.

In an embodiment, the outputs of the charge pump 117, which may supply additional power to amplifier interface 120, may be connected between an isolation device, such as diodes D1 or D2 (or FET devices), and a charge storing device, such as capacitors C1 or C2. In an embodiment, the anode of diode D1 may be connected to VCC and the cathode of diode D1 may be connected to a terminal of capacitor C1. The positive voltage supply output VCCP of charge pump 117 may be connected between diode D1 and capacitor C1. The other terminal of capacitor C1 may be connected to the charge pump 117.

In an embodiment, the cathode of diode D2 may be connected to a power source, such as VEE, or ground and the anode of diode D2 may be connected to a terminal of capacitor C2. The negative voltage supply output VEEP of charge pump 117 may be connected between diode D2 and capacitor C2. The other terminal of the capacitor C2 may be connected to the charge pump 117.

Controller 114 may control different settings of the signal amplification system for different performance capabilities. For example, there may be different xDSL power requirements depending upon the xDSL profile implemented for which the amplifier 120 may be used. Different xDSL technologies such as ADSL, ADSL2, PDSL, RADSL, SDSL, SHDSL, UDSL, VDSL, and VDSL2, commonly have different profiles. For example, VDSL2 has profiles P8b, P17 and P30, that provide different communication capabilities. Controller 114 may manage different settings in the amplification system to enable these different profiles and communication capabilities. In an embodiment, controller 114 may receive a default or user selected xDSL profile, and may, through outputs connected to the shared pump 110, amplifier interface 120, absolute value circuitry 111, maximum out block 113, gain block 115, and/or charge pump 117, send configuration instructions to the component(s) to accommodate the selected xDSL communications profile. In an embodiment, absolute value circuitry 111 may include separate amplifiers or gain blocks to provide different channels with different gains depending on the xDSL profiles used. In an embodiment, these separate amplifiers or gain blocks may be adjusted by controller 114 as needed.

Amplifier interface 120 may receive the input pair signals for each of the plurality of input channels 105 and the positive and/or negative amplifier supply voltages, VCCP/VEEP, from the charge pump 117. In an embodiment, there may be a pair of amplifiers for every input channel 105. In an embodiment, the amplifiers that interface with amplifier interface 120 may also have a bias signal received from the controller 114, which may change depending on the xDSL profile in use. In an embodiment, the amplifiers may be a non-rail-to-rail design. In some instances, non-rail-to-rail amplifiers may improve response speed to minimize delay between the time the input signals are applied to the amplifiers and the time the amplifier supply voltage is increased.

In an embodiment, during operation, a plurality of N-varying input signals may be sent through N different pairs of input channels 105 to absolute value circuitry 111. Each of the input signals in the N pairs of input channels may be sent to the absolute value circuitry 111 and to the amplifier interface 120. The absolute value of the voltage in each differential pair may be calculated through modules ABS-1 to ABS-N in the absolute value circuitry 111, and a gain may be applied to the magnitude of the absolute value of each voltage signal by the absolute value circuitry 111. The absolute voltage, including any gain applied by absolute value circuitry 111, may then be sent to a maximum out block 113.

The maximum out block 113, which may be implemented using OR gates, may compare the absolute voltages in corresponding differential pairs, and output highest voltage signal in each corresponding differential pair to the gain block 115. Gain block 115 may amplify the highest voltage signal outputted from the maximum out block 113 to a level enabling the charge pump 117 to generate a supply voltage capable of boosting the highest voltage signal without any signal loss. In an embodiment, controller 114 may also adjust the amplification at gain block 115 depending xDSL profile specifications.

In other embodiments, controller 114 may send configuration signals to the charge pump 117 to turn off the shared pump when no additional supply voltage is needed. In other embodiments, controller 114 may send configuration settings to shared pump 110 to provide either high or medium (i.e., mid-level) charging current within the shared pump 110 depending on the number of channels requiring additional power from the shared pump 110. In another embodiment, the controller 114 may specify the channels requiring additional supply voltage and may send configuration settings to enable or disable increased supply voltages on these channels. In another embodiment, the output of the charge pump 117 may increase the supply voltages, such as VCCP and VEEP, for all amplifiers within the amplifier interface 120.

In an embodiment, the charge pump 117 may include diodes D1 and D2 and capacitors C1 and C2, as shown in FIG. 1. Capacitor C1 may charge through diode D1 and capacitor C2 charges through diode D2. As the input signals 105 fluctuate, the power supply boost VCCP and/or VEEP from capacitors C1 and C2, respectively, may be provided to amplifier interface 120 to assure a sufficient supply voltage to accommodate peak signals requiring a supply voltage exceeding VCC or VEE/Ground. For example, the top plate of C1 may contain charge corresponding to VCC when the charge pump 117 is inactive and VCC may also be applied to the supply voltage of amplifiers 120. When the charge pump become active (e.g. signal on bottom plate moves by +5V), the top plate of C1 goes to VCC+5V. This configuration may also maintain a lower supply voltage, such as VCC, when the signal is operating in its normal range.

Depending on supply voltage increase sent to the amplifiers through amplifier interface 120, the amplifiers may be able to amplify and output the input signal to approximately twice the supply voltage, such as +/−12V for a +/−6V supply. In different embodiments, controller 114 may regulate the magnitude of the supply voltages, VCCP and VEEP, delivered to the output amplifiers as well as the bias current within the amplifier interface 120.

FIG. 2 shows an operational truth table that may be used by controller 114 in an embodiment of the invention. The controller 114 may use the truth table to identify settings for different components in the amplification system depending on the xDSL signal profile. In the exemplary truth table shown in FIG. 2, each channel is shown with two settings, PD0 and PD1. Each of the channel setting combinations shown may be used to identify the xDSL profile supported by the two channels. While only two channel settings, PD0 & P01, are shown, many more settings, PDx, can be added for further channel selectivity.

For example, in boxed row 201, channel 1 PD0, channel 1 PD1, and channel 2 PD0 are all set high, while channel 2 PD1 is set low. In this circumstance, channel 1 is turned off and channel 2 is profiled for P8$b$, in which case the charge pump is set to on; the charge current Ichrg is set to 1 times (1×) the normal charge current; the bias for the channel 1 amplifier, Amp #1 bias, is set to off; and the bias for the channel 2 amplifier, Amp #2 bias, is set to high.

Similarly, in boxed row 202, PD0 on both channels is set low, while PD1 on both channels is set high. In this case, both channel 1 and channel 2 are profiled for xDSL profile ADSL2+, in which case the charge pump is set to on; the charge current Ichrg is set to 2 times (2×) the normal charge current; and the channel amplifier biases, Amp #1 and #2 bias, are set to low.

These or other settings may be inputted to controller 114 through signals from connected devices, motherboards, or switch settings in different embodiments. Various settings may also be hard coded in controller 114. In some embodiments, a user may be able to dynamically change the settings through hardware, such as dual in-line package (DIP) switches, printed circuit board (PCB) connections, or programmable registers provided with the controller 114, enabling use of the same amplification system in a plurality of xDSL systems. Incorporating these changeable settings in an embodiment may also enable more efficient use of the amplification system, as unnecessary components can be shut off or minimized when not needed. For example, in an embodiment the charge pump 117 may be turned off when not in use to save power.

The settings also may be driven dynamically in an embodiment. For example, a setting in which the charge pumps may be on, such as ADSL2, may be selected for default operation. A signal may be received from a controller (not shown) after the controller detects a "crested event" requiring an output that exceeds the output amplifier's capabilities under the default settings. This received signal may trigger an increase the supply voltage sent to the amplifiers in order to accommodate the increased output requirements of the amplifier. Once the increased supply voltage is no longer needed, the supply voltages may revert to the default settings when the "crested event" expires. Of course, other examples may be derived from the present application.

Figure 3:
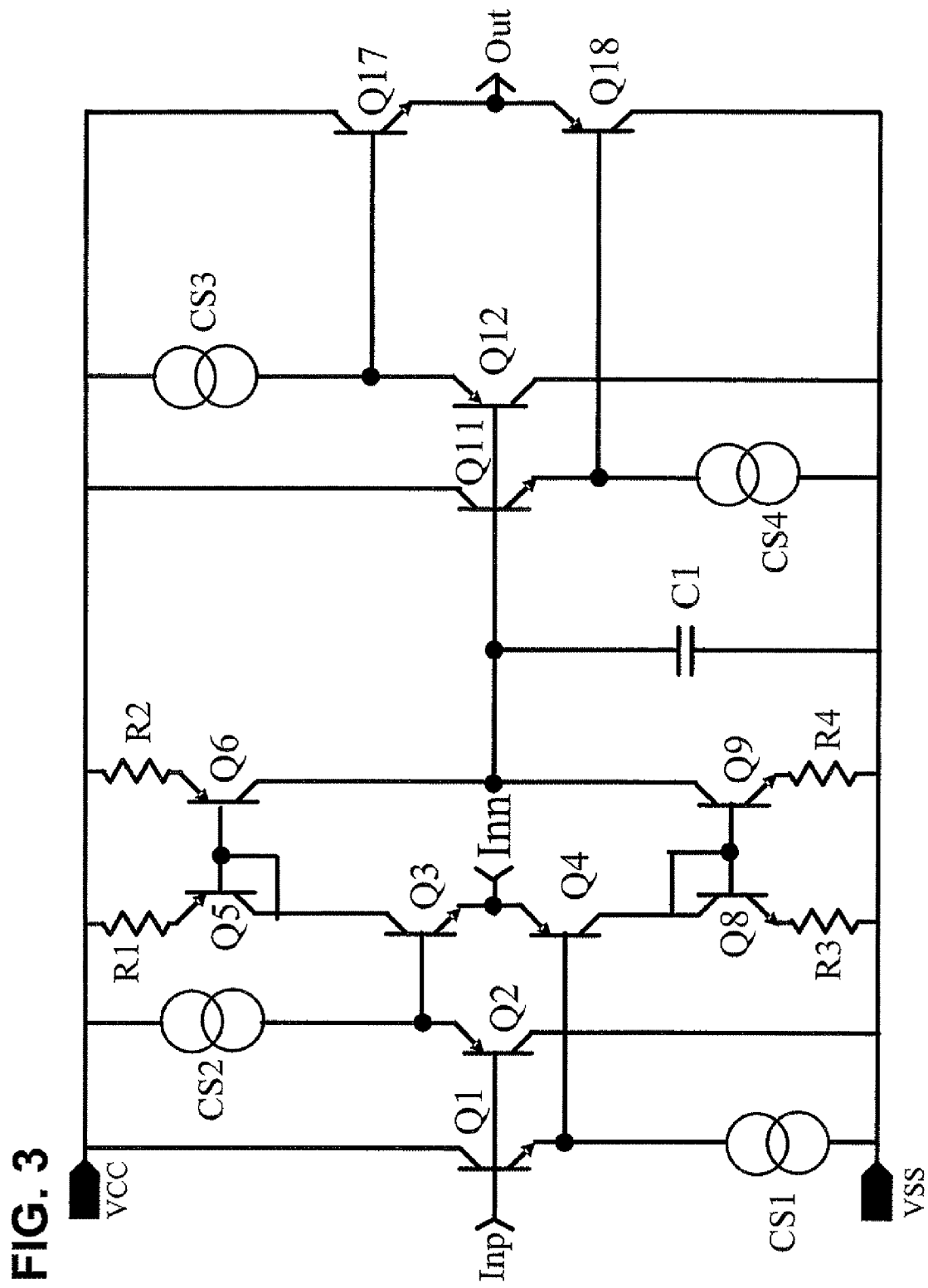
FIG. 3 shows a non-rail-to-rail amplifier that may be used in an embodiment.

FIG. 3 shows a non-rail-to-rail amplifier that may be used in an embodiment. In this embodiment, a plurality of transistors, resistors, and current sources may be used with a capacitor in the configuration shown to improve response times over a rail-to-rail amplifier. The improved response times enable VSDL 8 Mhz data rates in embodiments using non-rail-to-rail amplifiers, such as the one shown in FIG. 3. These non-rail-to-rail amplifiers may be used in the gain block 115 and as an output amplifier(s) that interfaces with the Amplifier Interface 120 to enable VDSL 8 Mhz data rates. Other designs of current feedback non rail-to-rail amplifiers can similarly be used in place of FIG. 3.

In FIG. 3, the high signal of a differential signal pair to be amplified may be coupled to the base of two transistors Q1 and Q2. The emitter of transistor Q1 may be coupled to the base of transistor Q4 and current source CS 1. Similarly, the emitter of transistor Q2 may be coupled to the base of transistor Q3 and current source CS2. The complementary low signal may be coupled to the emitter of transistors Q3 and Q4. The collector of transistor Q3 may be coupled to the collector of transistor Q5 and the base of transistors Q5 and Q6, while the collector of transistor Q4 may be coupled to the collector of transistor Q8 and the base of transistors Q8 and Q9.

The collectors of transistors Q6 and Q9 may be coupled to a capacitor C1 and the base of transistors Q11 and Q12. The emitter of transistor Q11 may be coupled to a current source CS4 and the base of transistor Q18, while the emitter of transistor Q12 may be coupled to a current source CS3 and the base of transistor Q17. The emitters of transistors Q17 and Q18 may be coupled to an output of the amplifier to provide the amplified signal.

Resistors R1 to R4 may be coupled between the emitters of transistors Q5 to Q8 and other voltage sources, such as VCC or VSS, or ground, while the remaining elements, such as the collectors Q1, Q2, Q11, Q12, Q17, and Q18, and the non-coupled connection of current sources CS1 to CS4 and capacitor C1 may be coupled to the voltage sources or ground.

Figure 4:
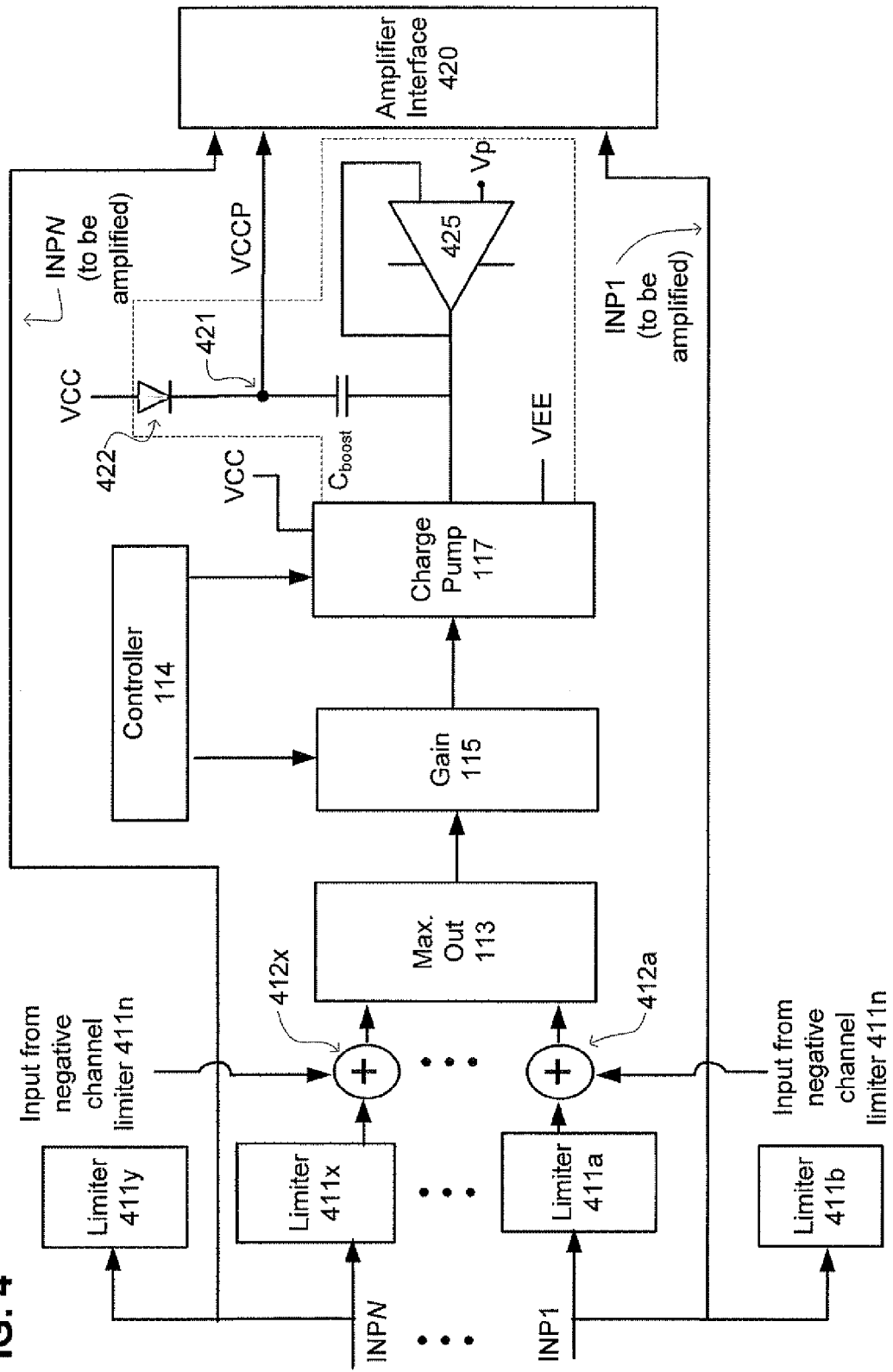
FIG. 4 shows an embodiment of an on-demand power supply system for one of the differential signals in a differential signal pair.

FIG. 4 shows an embodiment of an on-demand power supply system for one of the differential signals in a differential signal pair, INP. The corresponding differential signal INN is not shown in this figure, though the same principles apply. In this embodiment, a plurality of input signals may be sent to a plurality of first channel limiters. For example, input signal INP1 may be sent to first channel limiters 411$a$ and $b$, input signal INP2 may be sent to second channel limiters 411$c$ and $d$ (not shown), and input signal INPN may be sent to channel limiters 411$x$ and $y$.

The limiters 411$a$, $c$, and $x$ may limit the input voltages INP1, 2, and N to an input threshold. The limiters 411$b$, $d$, and $y$ may limit the input voltages INP1, 2$r$ and N to a second input voltage. The limited voltages outputted from limiters 411$a$, $c$, and $x$ may then be sent to summers 412$a$, $c$, and $x$ respectively. A limited input voltage 411$n$, from the corresponding different signal INN not shown in the figure, may also be sent to each summer 412$a$, $c$, and $x$ respectively.

The output from each summer 412 may then be sent to maximum output block 113, which sends the maximum signal to the gain block 115, as previously described. The gain block 115 may then amplify the signal before sending it to charge pump 117, as also previously described. In an embodiment, the controller 114 may send configuration signals to the gain block 115 and/or the charge pump 117 to set specific settings corresponding to the xDSL profile, for example profiles P8$b$ and P17, so the correct amplifier supply power requirements will be met.

In an embodiment, gain block 115 may output a signal to the charge pump 117, which in turn may generate a voltage greater than Vp at capacitor $C_{boost}$ when the sum of the input signals is approximately greater than two times a first input threshold voltage. The output voltage from the charge pump at node 421, VCCP, when input voltage INP does not exceed a voltage supported by existing amplifier supply voltage VCC, may be slightly less than VCC. A current restricting device, such as diode 422, may be part of the charge pump between VCC and node 421 to prevent reverse current flow to VCC in an embodiment. The amplifier 425 may also be part of the charge pump 117 to boost the voltage at the charge storing device $C_{boost}$ just as the charge storing device $C_{boost}$ may also be part of the charge pump 117 in some embodiments.

When the input voltages INP1 to INPN begin to fluctuate and rise above a threshold voltage supported by existing amplifier supply voltage VCC, the voltage VCCP may also rise above the supply voltage VCC. The voltage VCCP may supply power to the amplifiers that interface with amplifier interface 120. The same amplifiers may then amplify input signals INP1 to N through a connection to the amplifier interface 120.

The corresponding differential signals INN1 to INNN that are not shown in FIG. 4 may be processed in a similar manner described in the preceding paragraphs with respect to differential signals INP1 to INPN and shown in FIG. 4.

Figure 5:
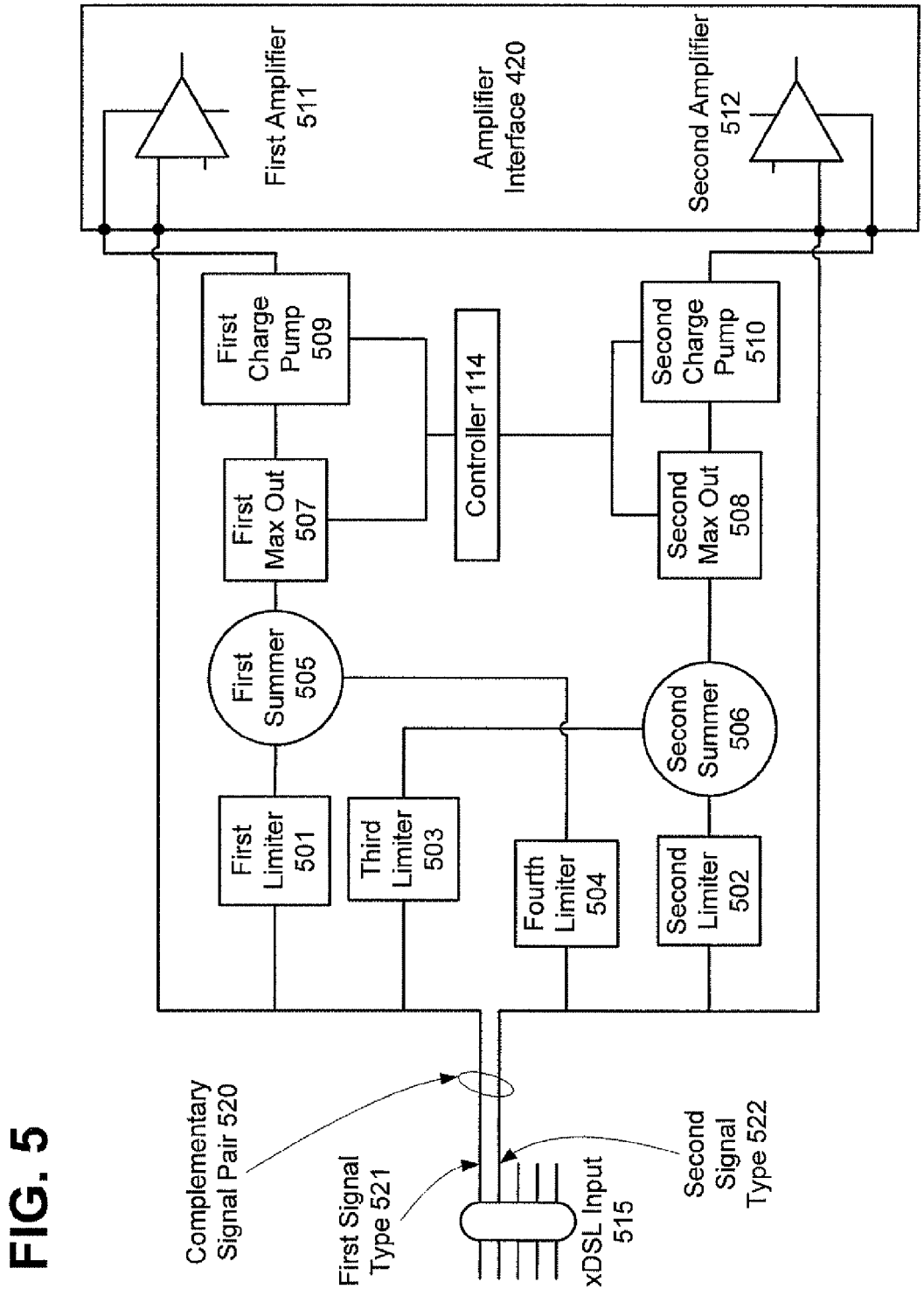
FIG. 5 shows an embodiment of an on-demand power supply system for one complementary differential signal pair.

FIG. 5 shows an embodiment of an on-demand power supply system for one complementary differential signal pair. An xDSL signal input 515 may have a plurality of complementary differential signal pairs 520. Each of these complementary signal pairs 520 may carry one of two complementary signal types, a first signal type 521 or a second signal type 522. In an embodiment, each signal of the first signal type 521 may be connected to a distinct first amplifier 511, a distinct first limiter 501, and a distinct third limiter 503. In an embodiment, each signal of the second signal type 502 may be connected to a distinct second amplifier 512, a distinct second limiter 502, and a distinct fourth limiter 504.

In an embodiment, each distinct first limiter 501 and the corresponding fourth limiter 504 of the corresponding complementary signal 522 may be connected to a corresponding first summer 505. Each distinct second limiter 502 and the corresponding third limiter 503 of the corresponding complementary signal 521 may be connected to a corresponding second summer 506.

In an embodiment, the results from each of the first summers 505 in each complementary signal pair 520 may be sent to a first maximum out block 507, which selects the signal pair 520 with the highest combined voltages. Similarly, the results from each of the second summers 506 in each complementary signal pair 520 may be sent to a second maximum out block 508, which selects the signal pair 520 with the highest combined voltages.

In an embodiment, the first maximum out block 507 may also be connected to the first charge pump 509, which in turn, may be connected to the supply voltage of each distinct first amplifier 511. Similarly, the second maximum out block 508 may also be connected to the second charge pump 510, which in turn, may be connected to the supply voltage of each distinct second amplifier 512.

In an embodiment, a gain block, such as gain block 115, may also be inserted between or included as part of the aforementioned elements of the system shown in FIG. 5. For example, a gain block 115 could be inserted between the first maximum out block 507 and the first charge pump 509 to amplify the signal being inputted to the first charge pump 509.

Similarly, a gain block 115 could be inserted between the second maximum out block 508 and the second charge pump 510 to amplify the signal being inputted to the second charge pump 510.

In an embodiment, the controller 114 may also be connected to any or all of the maximum out blocks 507/508, gain blocks 115, the first or second charge pumps 509/510, and/or signals of the xDSL signal 515.

Different embodiments may be used in one or more xDSL communications devices depending on the requirements of the application. Examples of xDSL communications devices that may contain an embodiment of the invention include, but are not limited to, modems, access multiplexers, routers, gateways, or terminal adapters.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, some of the described embodiments may refers to diodes or capacitors, but other current restricting or charging storing devices may be used instead.

I claim:

1. A multichannel amplifier system, comprising:
    a plurality of amplifiers, each having an input for a respective input channel and having a power supply input,
    a charge pump system coupled to the power supply inputs of the amplifiers,
    a control system for the charge pump system, comprising logic to identify the input channel having a signal value with a highest absolute voltage amplitude from among a subset of the input channels and to deliver the identified signal value of the input channel in each subset to the charge pump system as a control signal to the respective amplifiers when the identified signal value exceeds a threshold, and
    a gain block for amplifying the signal value of the identified input channel.

2. The system of claim 1, where the logic comprises an absolute value circuit and a maximum out block.

3. The system of claim 1, where the subset includes every input channel.

4. The system of claim 1, further comprising two subsets of input channels, a first subset comprising a first set of signals in each differential signal pair and a second subset comprising the complementary signal in each differential signal pair.

5. The system of claim 4, where the first set of signals is a set of high signals in each differential signal pair and the second set of signals is the complementary set of low signals in each different signal pair.

6. The system of claim 1, further comprising a controller connected to the control system.

7. The system of claim 6, where the controller is further connected to each differential signal input.

8. The system of claim 7, where the controller further comprises a configuration setting input connected to at least one of the configuration ports.

9. The system of claim 8, where the configuration setting input is at least one of: a hardwired input, a DIP switch, and a printed circuit board connection.

10. The system of claim 8, where the configuration setting input is a programmable register.

11. The system of claim 1 where the gain block comprises a non-rail-to-rail amplifier.

12. The system of claim 1, where at least one amplifier is a non-rail-to-rail amplifier.

13. The system of claim 1, further comprising an amplifier interface comprising an interface for coupling:
    each input signal to the corresponding amplifier input channel and
    each highest absolute voltage amplitude to the power supply inputs of the respective amplifiers.

14. The system of claim 1, further comprising a communications device, the communications device comprising the plurality of amplifiers, the charge pump system, and the control system.

15. The system of claim 1, where the communications device is at least one of: a xDSL modem, a xDSL access multiplexer, xDSL router, xDSL gateway, or a xDSL terminal adapter.

16. A method comprising:
- sending each input channel in a multi-channel xDSL input signal to an input of a distinct amplifier;
- identifying the input channel having a highest absolute voltage amplitude;
- adding a voltage gain to the identified input channel;
- determining whether a voltage of the identified input channel exceeds a threshold;
- when the voltage exceeds the threshold, supplying each amplifier with a supply power proportional to the voltage of the identified highest amplitude input channel and exceeding a default supply power; and
- otherwise, supplying each amplifier with the default supply power.

17. The method of claim 16, further comprising:
- identifying a subset of input channels;
- identifying the input channel having the highest absolute voltage amplitude in the subset;
- when the voltage of the identified input channel in the subset exceeds the threshold, supplying each amplifier in the subset with the supply power exceeding the default supply power; and
- otherwise, supplying each amplifier in the subset with the default supply power.

18. The method of claim 17, further comprising two subsets of input channels, a first subset comprising a first set of signals in each differential signal pair and a second subset comprising the complementary signal in each differential signal pair.

19. The method of claim 16, where the threshold is the default supply power and the supply power exceeding the default supply power is the voltage of the identified input channel including the added gain.

20. The method of claim 16, further comprising using a controller to adjust at least one of: the input channel and the supply power.

21. The method of claim 16, where the controller dynamically adjusts the at least one of the input channel and the supply power through at least one of: a printed circuit board connection and a programmable register.

22. The method of claim 17, where at least one input channel is amplified using a non-rail-to-rail amplifier.

* * * * *